United States Patent [19]

Denda

[11] Patent Number: 5,132,566
[45] Date of Patent: Jul. 21, 1992

[54] BIMOS SEMICONDUCTOR INTEGRATED CIRCUIT HAVING SHORT-CIRCUIT PROTECTION

[75] Inventor: Akira Denda, Tokyo, Japan
[73] Assignee: NEC Corporation, Tokyo, Japan
[21] Appl. No.: 557,990
[22] Filed: Jul. 25, 1990

[30] Foreign Application Priority Data

Jul. 27, 1989 [JP] Japan .................................. 1-194775

[51] Int. Cl.⁵ ........................................... H03K 17/08
[52] U.S. Cl. .................... 307/446; 307/296.5;
307/443; 307/570; 361/88
[58] Field of Search .............. 307/446, 570, 456, 448,
307/315, 482.1, 296.5; 357/43; 361/86, 88

[56] References Cited

U.S. PATENT DOCUMENTS

| | | | |
|---|---|---|---|
| 4,424,455 | 1/1984 | Neely | 307/446 X |
| 4,638,186 | 1/1987 | McLaughlin | 307/446 |
| 4,649,294 | 3/1987 | McLaughlin | 307/446 |
| 4,746,817 | 5/1988 | Banker et al. | 307/446 X |
| 4,760,433 | 7/1988 | Young et al. | 357/43 X |
| 4,791,320 | 12/1988 | Kawata et al. | 307/446 |

Primary Examiner—David Hudspeth
Attorney, Agent, or Firm—Helfgott & Karas

[57] ABSTRACT

An output circuit capable of limiting an output current from a BiMOS semiconductor integrated circuit without adversely affecting an operational speed includes a plurality of bipolar transistors connected to form a Darlington circuit and at least one field effect transistor which can be either a P-channel or an N-channel transistor. The circuit is capable of removing rise current limitations of the bipolar transistors in the Darlington circuit during a normal operation by using a single MOS transistor to provide a branch circuit for the Darlington circuit, which limits the output current of the circuit under the specific condition that it provides a high level output and its output terminal is short-circuited to the ground.

8 Claims, 5 Drawing Sheets

BIMOS SEMICONDUCTOR INTEGRATED CIRCUIT HAVING SHORT-CIRCUIT PROTECTION

BACKGROUND OF THE INVENTION

The present invention relates to a semiconductor integrated circuit such as a TTL (transistor transistor logic) output circuit and, more particularly, to a TTL output circuit capable of limiting an output current when an output terminal of the TTL output circuit is short-circuited to ground potential while an output voltage thereof is at a high level.

Typically, voltage level input/output interfaces of digital integrated circuits can be generally classified into ECL (emitter coupled logic) level for high speed operation, TTL level for intermediate speed operation and CMOS level for low speed operation. However, with recent improvements in transistor performance, there is a tendency that the operation speed range to be covered by the TTL is partially overlapped with that for the CMOS level and the range to be covered by the ECL level is also partially overlapped with that for the TTL level.

A conventional TTL output circuit comprises two Darlington-connected NPN transistors. In this circuit, when the output terminal of the Darlington circuit is short-circuited to ground potential, while the output voltage thereof is high, the current flow through the Darlington circuit is large enough to cause bonding wires thereof to be melted down. Therefore, in order to limit the collector current, a resistor is connected in series with the collector of the NPN transistor at the output side of the Darlington circuit. More specifically, the potential at the above-mentioned collector is lowered by a potential drop accross the resistor. This is caused by an increased collector current due to the short circuit of the output terminal, so that the transistor at the output side of the Darlington circuit is saturated, to thereby limit the output current.

This conventional output circuit processes a significant short-coming. Specifically, the current limiting resistor, which is intended to limit the collector current, also limits a transient current of the NPN transistor at the output side of the Darlington circuit during the rise time of high speed normal operation. The speed of the normal operation is adversely affected accordingly. As the simplest way for overcoming such a drawback, removing the current limiting resistor has been proposed, that is, connecting the collector of the above-mentioned NPN transistor directly to the power source voltage. Such a measure then results in the problem of unlimited large collector current from the transistor.

SUMMARY OF THE INVENTION

The object of the present invention is to provide a BiMOS semiconductor integrated circuit having an output circuit capable of removing, from the Darlington circuit during normal operation, rise current limitations, thus realizing a high speed operation, while an amount of current flowing in the transistors constituting the Darlington circuit at the short circuit state of the output terminal, is restricted so as to secure the bonding wires thereof.

The present invention provides a BiMOS semiconductor integrated circuit including a plurality of bipolar transistors and at least one field effect transistor formed on a common semiconductor chip. The bipolar transistors form a Darlington circuit for providing a high voltage level at an output node of the circuit. The field effect transistor can be either a P-channel or an N-channel field effect transistor.

According to a first embodiment of the present invention, a P-channel field effect transistor has the source connected to the base of an NPN transistor on the input side of a Darlington circuit and the gate and a drain commonly connected to the emitter of an NPN transistor on the output side of the Darlington circuit. In operation of the output circuit according to the present invention, the P-channel transistor is turned 'ON' when the output node of the Darlington circuit is unfavourably grounded while in a high voltage level operation, thus limiting the current flowing through the Darlington circuit, and also a low level output supply circuit is provided for supplying a low voltage level to the output node.

Furthermore, according to a second embodiment of the present invention, the field effect transistor is an N-channel MOS transistor having the gate and the drain commonly connected to the base of the NPN transistor on the input side of the Darlington circuit and the source connected to the emitter of the NPN transistor on the output side of the Darlington circuit, and a low level output supply circuit is provided for supplying a low voltage level to the output node.

Consequently, in the BiMOS semiconductor integrated circuit constructed as above, the P or N channel field effect transistor prevents large collector current of the bipolar transistor from being generated when the output terminal is short-circuited to ground in a high voltage level operation. On the other hand, the NPN transistor at the output side of the Darlington circuit is directly connected to the source potential line (VCC line) so that the rising current thereof, during the normal operation, is not limited realizing a high speed operation.

BRIEF DESCRIPTION OF THE DRAWINGS

The above and further objects, features and advantages of the present invention will become more apparent from the detailed description taken in conjunction with the following accompanying drawings, wherein.

DESCRIPTION OF THE PREFERRED EMBODIMENTS

Figure 1:
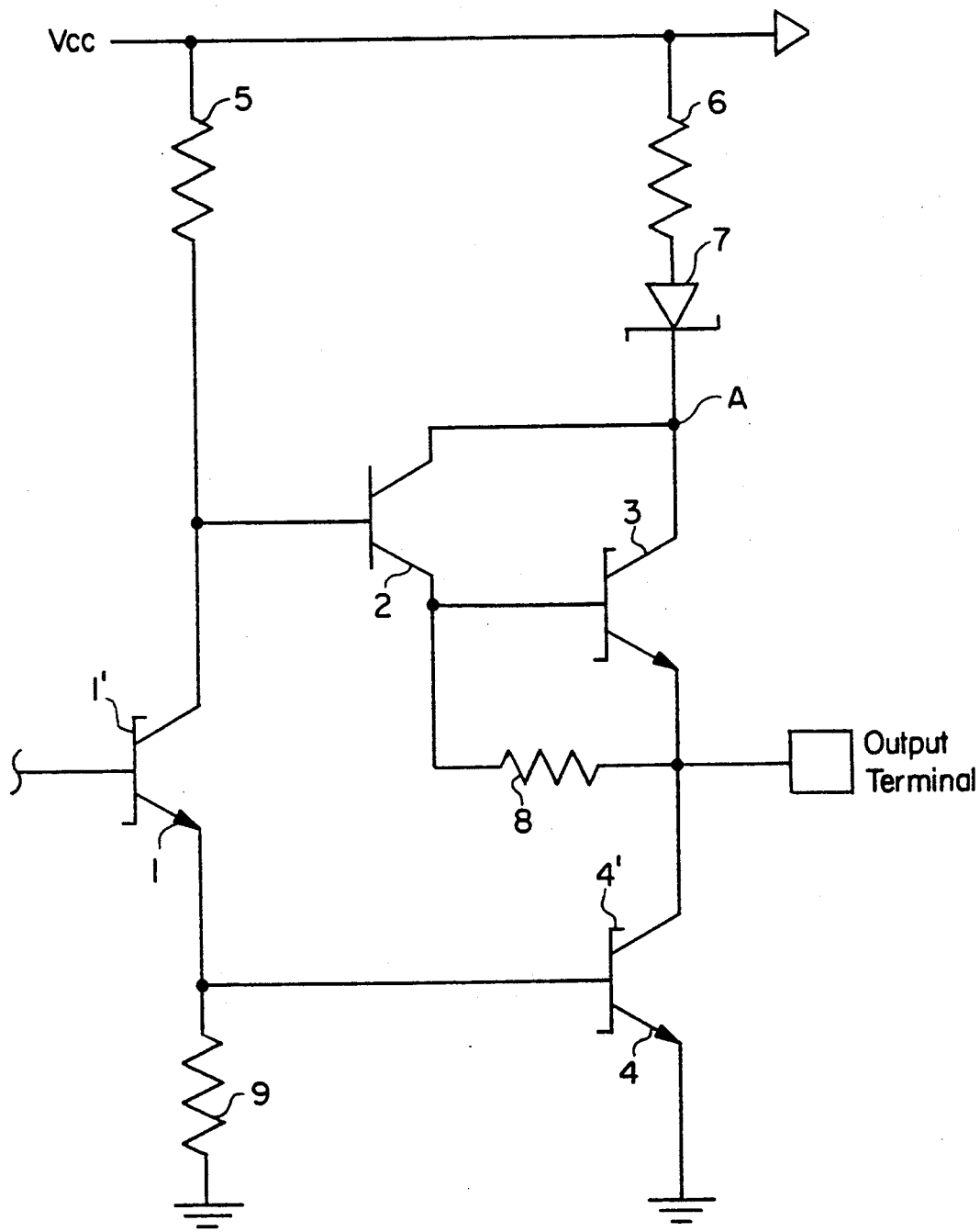
FIG. 1 is a circuit diagram of a conventional output current limiting circuit.

In a conventional output current limiting circuit as shown in FIG. 1, current limiting means is provided in the form of a resistor 6. More specifically, NPN transistors 2 and 3 form a Darlington circuit wherein the collector of each NPN transistors 2 and 3 is connected in series to the power supply (VCC) via the resistor 6 and the Schottky barrier diode 7. The emitter of NPN transistors 3 is connected to the collector of NPN transistor 4 along with the emitter of transistor 2 which is also connected to the collector of transistor 4 through resistor 8. The emitter of NPN transistor 4 in turn is connected to ground (0 volt line). The base of the input NPN transistor 2 of the Darlington circuit is connected between a resistor 5 which in turn is connected to power supply voltage line VCC, and the collector of NPN transistor 1. The emitter of the 15. NPN transistor 1 is connected to ground through a resistor 9. Furthermore, the base of NPN transistor 4 is connected between NPN transistor 1 and resistor 9.

In operation, a "low" voltage level is determined by the difference between a base-emitter forward voltage of the NPN transistor 4 in the high current range, and a forward voltage of a Schottky barrier diode (SBD) 4' which exists in the forward direction between the base and collector of the NPN transistor 4. Therefore, with a typical base-emitter forward voltage of about 0.8 V, and SBD forward voltage of about 0.6 V, the "low" voltage level becomes about 0.2 V. On the other hand, a "high" voltage level is determined by the difference between the power source voltage (VCC) and the sum of the base-emitter forward voltages of the Darlington connected NPN transistors 2 and 3 in the low current range. Therefore, with a typical source voltage (VCC) of 5.0 V and the base-emitter forward voltage being 2×0.6 V, the "high" voltage level becomes 3.8 V.

The resistor 6 is used to limit the current flow through the Darlington-connected NPN transistors 2 and 3. The potential drop across the resistor 6 causes the potential at a node A connected to the collector of the NPN transistor 3, to be lowered because of an increased collector current in the NPN transistor 3 due to the short circuit of the output terminal. Thus, the NPN transistor 3 is saturated and thereby limits the output current. However, this current limiting resistor which is intended to limit the collector current, also limits a transient current of the NPN transistor 3 during the rise time of high speed operation.

Figure 2:
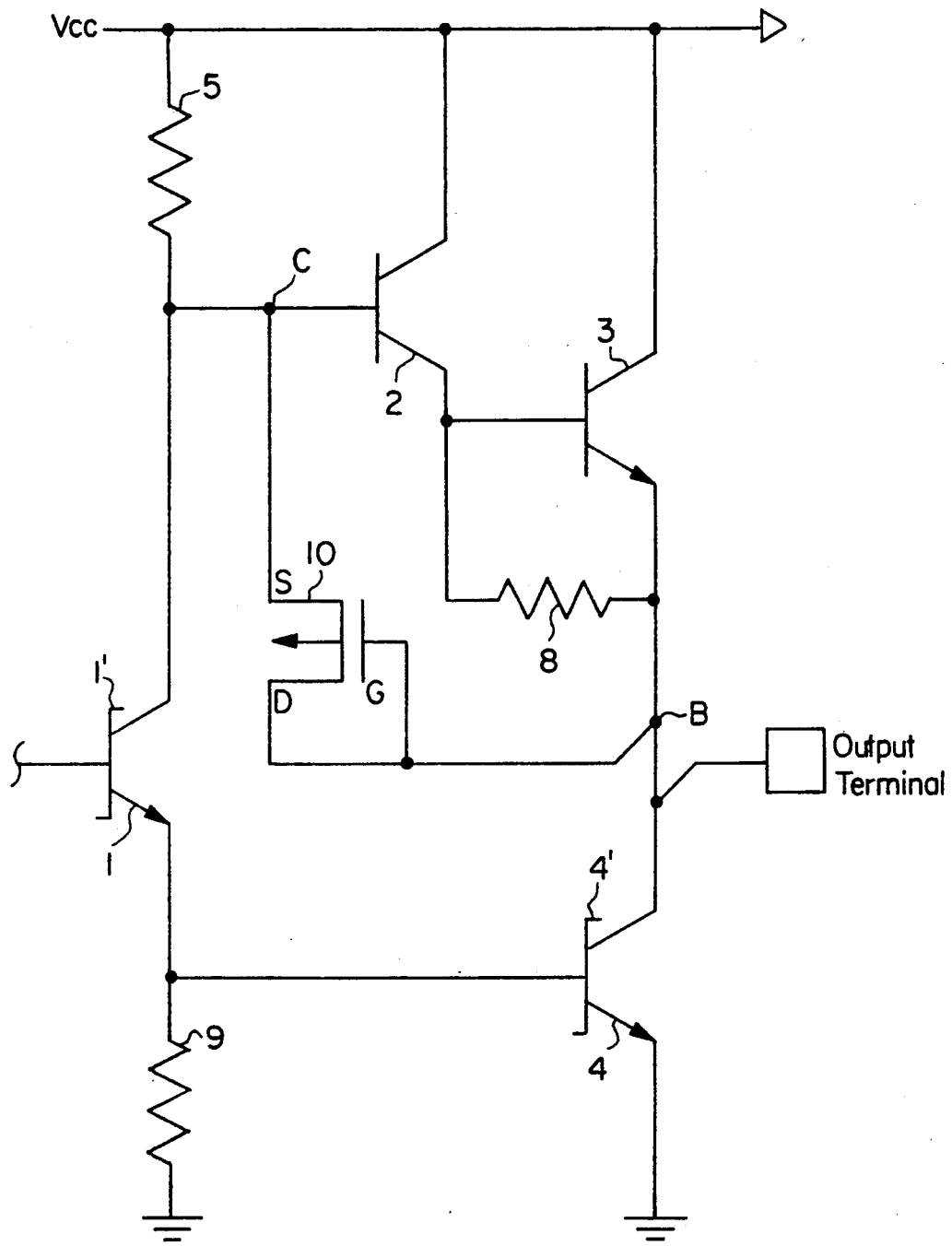
FIG. 2 is a circuit diagram of an output current limiting circuit according to a first embodiment of the present invention.

Referring now to FIG. 2, in which like numerals denote like components shown in FIG. 1, an embodiment of this invention includes at least one P-channel field effect transistor 10 for current limiting purposes. More specifically, NPN transistors 2 and 3 form a Darlington circuit wherein both collectors are directly connected to the power supply line VCC, and both emitters are connected at a node B which is also connected to the collector of NPN transistor 4 whose emitter is connected to ground (OV). The gate (G) and drain (D) of the P channel field effect transistor 10 are also connected at a node B and the source (S) is connected at a node C to the base of the NPN transistor 2. The base of NPN transistor 2 is also connected between one end of resistor 5, the other end of which is connected to the VCC line, and the collector of NPN transistor 1, the emitter of which is connected to the ground line through resistor 9.

Figure 5:
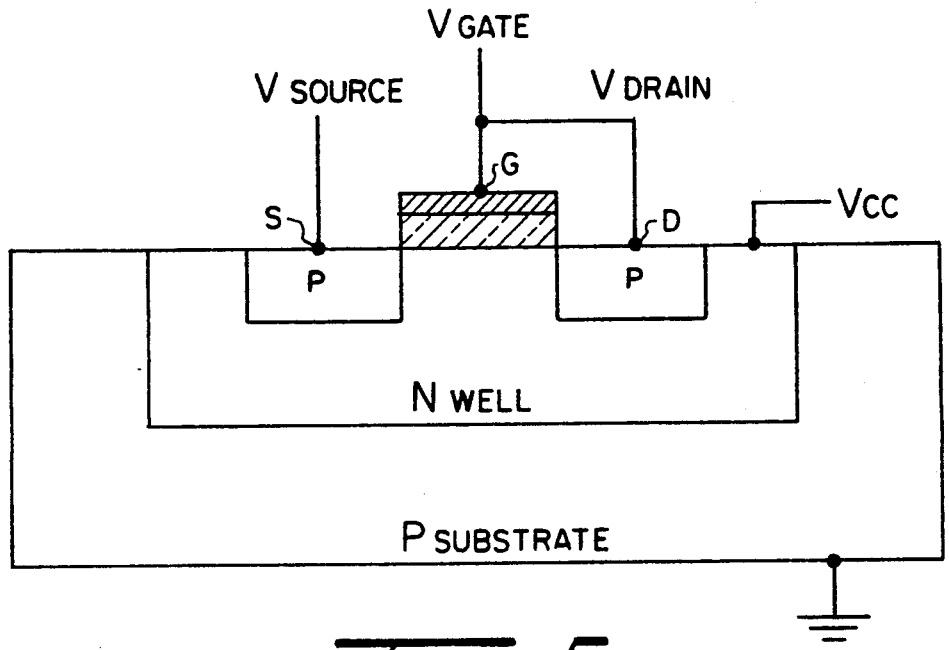
FIG. 5 is a cross sectional view of a P channel MOS transistor according to the first embodiment of the present invention.

Considering the operation of the first embodiment of this invention in which the field effect transistor 10 is a P channel MOS transistor formed on an N-well provided in a P⁻-type silicon substrate. To the N-well, a constant voltage of 5 V (VCC) is applied, while the P-type substrate maintains the ground potential (0 volt) as shown in FIG. 5. In FIG. 2, a "high" voltage level is provided at the output, NPN transistors 2 and 3 are in an "ON" state and the potential at the node C, that is, at the base of the NPN transistor 2 is increased substantially to a power source voltage VCC, and also $V_S$ (source voltage of the transistor 10) becomes VCC where, $$VCC = V_C = V_S = 5 \text{ V}$$

with $V_C$ being the voltage at the node C. On the other hand, a voltage level $V_B$ at the node B of the NPN transistor 3, that is, the output terminal of the circuit, becomes as follows:

$$V_B = V_{CC} - 2(2 \times VF') = 3.8 \text{ V}$$

and $$V_s = V_D = V_{Gb} = 3.8 \text{ V}$$

where $V_D$ and $V_G$ are the drain and gate voltages of the transistor 3, respectively, and where VF', the baseemitter forward voltage, is 0.6 V for each of the NPN transistors 2 and 3 in the low current range. Under these conditions, source voltage ($V_S$) and N-well voltage (VCC) are the same value (5 V), and therefore, the absolute value of the threshold voltage $|V_{TP}|$ of the transistor 10 becomes 0.8 V (point E in FIGS. 4(a) and (b)), and absolute values of the gate-source voltage $V_{GS}$ and the drain-source voltage $V_{DS}$ of the P-channel MOS transistor 10 are:

$$|V_{GS}| = |V_{DS}| = 1.2 \text{ V}$$

Figure 4A:
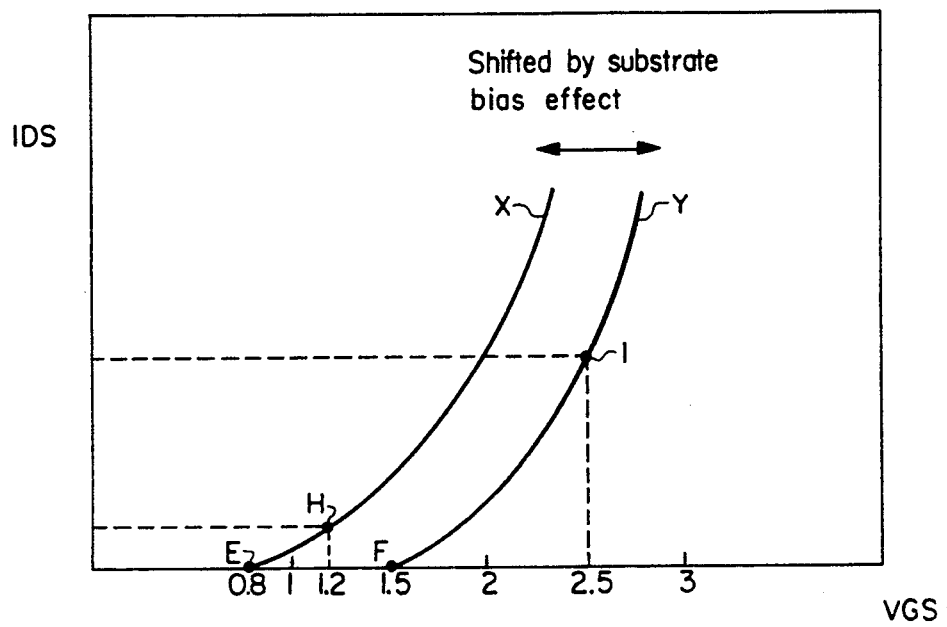
FIGS. 4(a) and 4(b) are graphical representations of $|V_{GS}|$, $|V_{DS}|$ vs. $I_{DS}$, and substrate bias effect on the threshold voltage ($V_{TP}$), respectively.

From the curve X in FIG. 4(a), $I_{DS}$ (source-drain transistor current) becomes a value shown by point H. Therefore, the P channel MOS transistor 10 seems to be turned 'ON' since the $|V_{GS}|$, $|V_{DS}|$ is slightly larger than $|V_{TP}|$.

However, since the driving current indicated by point H, of the P channel MOS transistor 10 is negligible and its linear range is wider than that of an N-channel MOS transistor, substantially no current flows through the MOS transistor 10.

On the other hand, when a low voltage level is provided at the output, NPN transistors 1 and 4 are in the 'ON' state and the potential $V_C$ at the node C of the NPN transistor 2 and of the source (S) of the P channel transistor 10 becomes as follows:

$$V_C = (2 \times VF) - VF \text{ (SBD)} = 1.0 \text{ V}$$

where VF is the base emitter forward voltage of the NPN transistors 1 and 4, respectively, in a high current range and VF (SDB) is the forward voltage (about 0.6 V) of the SBD '1 which exists in the forward direction between the base and the collector of the NPN transistor 1. The potential $V_B$ at the node B of the emitter of the NPN transistor 3 in this case becomes:

$$V_B = VF[0.8 \text{ V}] - VF \text{ (SDB) } [0.6 \text{ V}] = 0.2 \text{ V}$$

The source voltage ($V_S$) of the transistor 10 is 1.0 V and the N-well voltage (VCC) is 5.0 V, and therefore, $$V_S - VCC \text{ (well)} = 4 \text{ V}$$

Figure 4B:
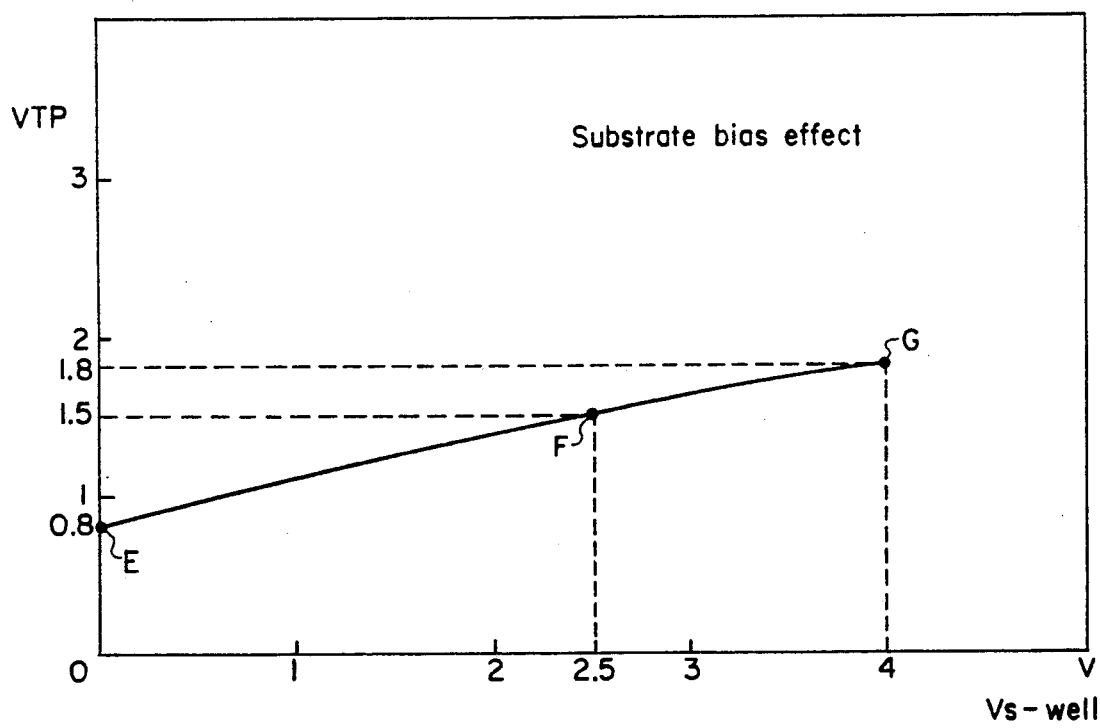

From point G in FIG. 4(b), the absolute threshold voltage ($V_{TP}$) becomes 1.8 V which is lower than the absolute values of the gate-source voltage $V_{GS}$ and drain-source voltage VDS of the P channel MOS transistor 10, because these values are:

$$V_{GS}=V_{DS}=0.8 \text{ V}$$

Therefore, the P-channel MOS transistor 10 is not turned 'ON' and no driving current flows in the transistor 10.

According to this invention, if the output of the circuit is short-circuited to ground when it is in a high level operation, then it is possible to turn on the P channel MOS transistor 10. More specifically, if the emitter area of the NPN transistor 2 is designed such that the base-emitter forward voltage (VF) becomes sufficiently large when the high level output is short-circuited, then the P-channel MOS transistor 10 is turned 'ON'. That is, depicting the base-emitter forward voltages of each of the NPN transistors 2 and 3, in the high current range, by VF(2) and VF(3), respectively, where with $VF(2) = 1.5 \text{ V}$ and $VF(3) = 1.0 \text{ V}$ $V_B = V_D = V_G = 0 \text{ (GND)}.$ Then $V_C = V_S = 2.5 \text{ V}$ and $VCC = 5 \text{ V}$ with $V_S = 2.5 \text{ V}$ therefore $|VCC \text{ (well)} - V_S| = 2.5 \text{ V}$ and $|V_{GS}| = |V_{DS}| = 2.5 \text{ V}$ From the point F in FIGS. 4(a) and (b), the absolute value of threshold voltage is 1.8 V. From the characteristic curve V in FIG. 4(a), a large amount of current indicated by the point I flows in the transistor 10. That is, a source potential of the P-channel MOS transistor 10 is lower than the N-well potential and the absolute value of the threshold voltage $|V_{TP}|$ of the MOS transistor 6 is in the order of 1.5 V due to the substrate effect. However, since the gate-source voltage ($V_{GS}$) and the drain-source voltage ($V_{DS}$) are large enough, it is possible to limit the base current of the NPN transistor 2 and hence the output current.

Figure 3:
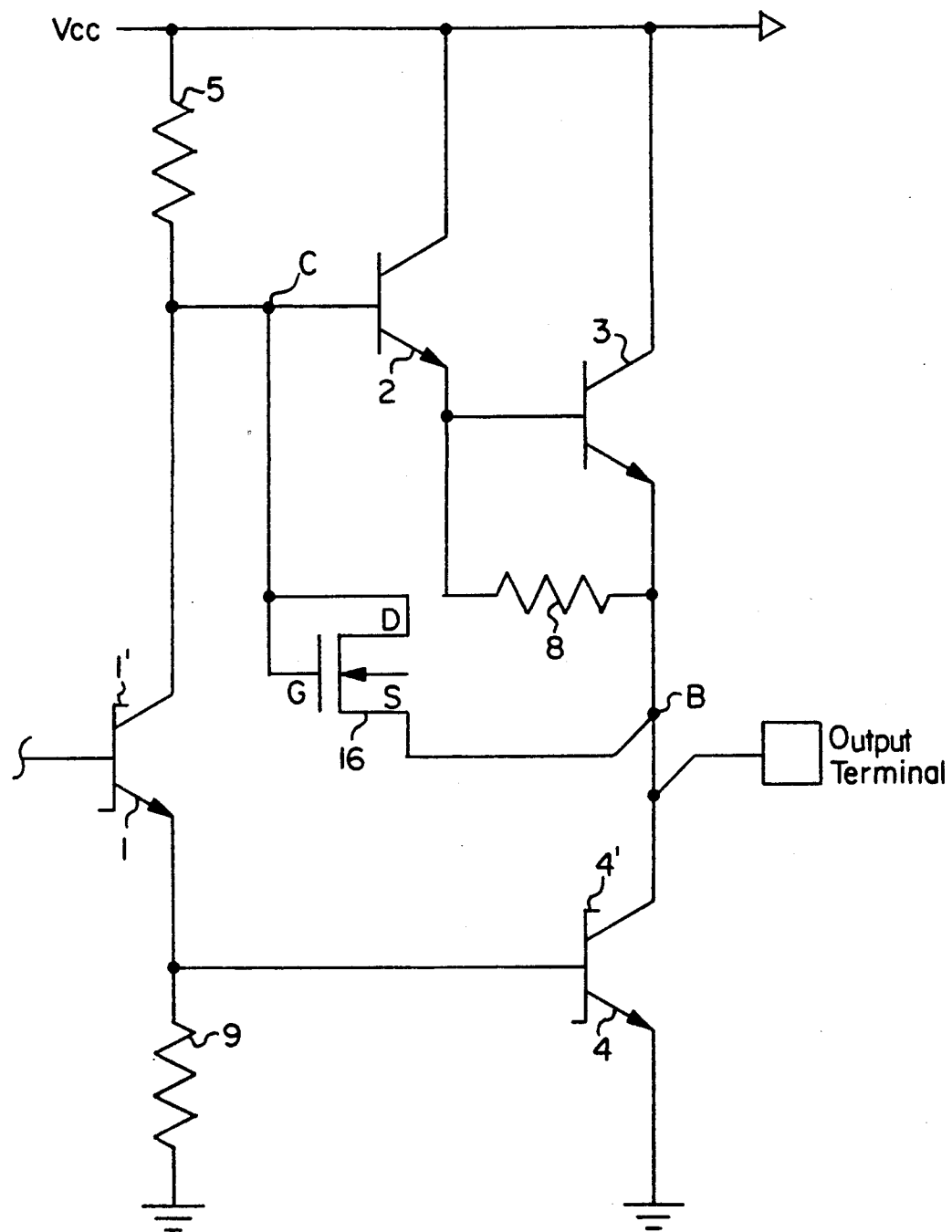
FIG. 3 is a circuit diagram of an output current limiting circuit according to a second embodiment of the present invention.
Figure 6:
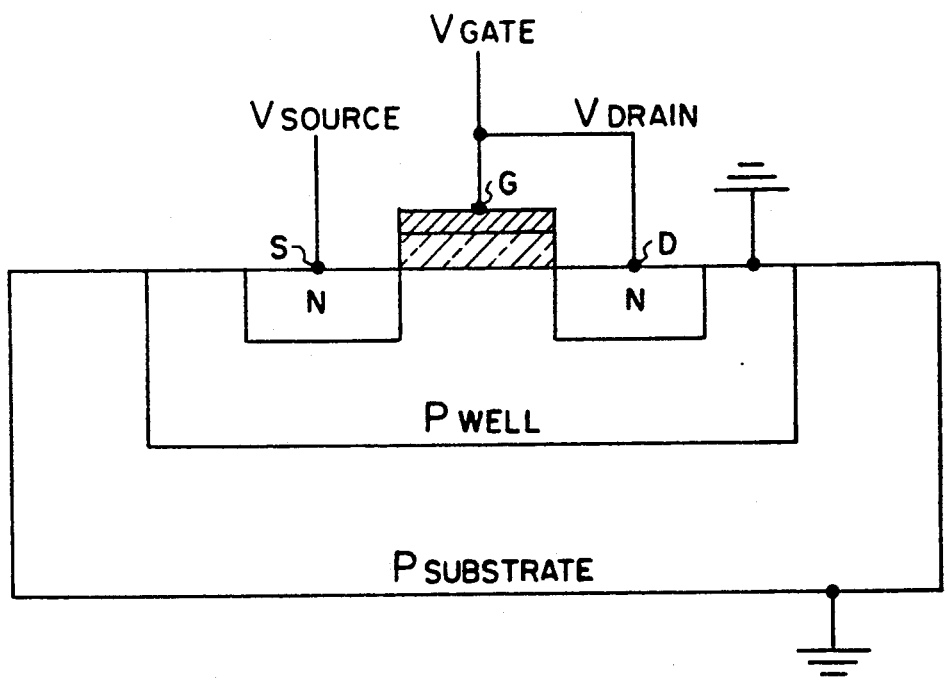
FIG. 6 is a cross sectional view of an N channel MOS transistor according to the second embodiment of the present invention.

FIG. 3 shows the second embodiment of the present invention. This embodiment differs from that shown in FIG. 2 in that an N channel MOS transistor 16 is used instead of P channel MOS transistor 10. The N channel MOS transistor 16 in this embodiment is formed on a P-well where the ground potential (0 volt) is applied as shown in FIG. 6.

In operation, when the output of this circuit is at a high level, NPN transistors 2 and 3 are 'ON' and the potential at the node C of the base of the NPN transistor 2 is increased substantially to a power source voltage VCC (5 V). Therefore, a voltage level $V_B$ at the node B of the emitter of NPN transistor 3, that is, of the output terminal of the circiut becomes as follows:

$$V_B = VCC - (2 \times VF') = 3.8 \text{ V}$$

as in the case of the circiut shown in FIG. 2. since, in this case the source potential ($V_S$) of the N-channel MOS transistor 16 s higher than the -well potential ($\sim$ OV), the threshold voltage ($V_{TN}$) becomes about 2.0 V due to the substrate bias effect because of the source voltage ($V_S$) being 5 V. On the other hand, $$|V_{GS}| = |V_{DS}| = 1.2 \text{ V}$$

which is lower than $V_{TN}$. Therefore, the N channel MOS transistor 16 is not turned 'ON'.

Furthermore, when the output of this circiut is at a lowe level, NPN transistors 1 and 4 are in the 'ON' state and the potential $V_C$ at the node C at the base of the NPN transistor 2 becomes as follows;

$$V_C = (2 \times VF) - VF \text{ (SBD)} = b 1.0 \text{ V}$$

where VF is the base emitter forward voltage of the NPN transistors 1 and 4, respectively in a high current range, VF (SBD) is the forward voltage of the SBD 1' and the voltage $V_B$ jof the node B is 0.2 V as in the first embodiment. Under tese conditions, absolute values of the gate-source voltage ($V_{GS}$) and the drain source voltage ($V_{DS}$) of the N channel MOS transistor 16 are $$|V_{GS}| = |V_{DS}| = 0.8 \text{ V}$$

Although the $V_{TN}$ is decreased to the 0.7 to 0.8 V range by the substrate bias effect because of the source voltage ($V_S$) being 0./2 V, the N channel MOS transistor is substantially not turned 'ON'.

In the case where the output circiut is short-circuited to ground when it is in a high level operation, it is possible to turn 'ON' the MOS transistor 16. More specifically, if the emitter area of the NPN transistor 2 is designed such that the base-emitter forward voltage (VF) of a high current state becomes sufficiently large when the high level output is short-ciricuted so that the N channel MOS transistor is turned 'ON'.

That is, cdepicting the base-emitter forward voltages of each of the NPN transistors 2 and 3, in the high current range, by VF(2) and VF(3) respectively, then VF(2)=1.5 V and VF(3)=1.0 V and therefore, the voltage difference between the voltage $V_C$ and the node C and the voltage $V_B$ at the node B is $$V_C - V_{Bn} = 2.5 \text{ V}$$

Consequently, $$|V_{GS}| = |V_{DS}| = 2.5 \text{ V}.$$

Since, in this case, the source potential of N-channel MOS transistor 16 is $\sim$OV and there is no substrate effect, the Vphd TN is about 0.7 V. The N channel MOS 16 is deeply turned 'ON', so that the base current of the NPN transistor 2 is limited and hence the output current is limited.

Thus, the present invention which includes a MOS transistor connected so that it is only effectively turned-'ON' when the output terminal is at a high level and when short-circiuted to ground potential, provides a current limiting circiut which has no adverse effect on a normal output circiut operation. Thus, the present invention limits the output current only during the output short circiut condition making it possible to increase the operating speed of a TTL output.

What is claimed is:

1. A BiMOS semiconductor intergrated circiut comprising:
   a first power source voltage line for supplying a first power source voltage;

a second power source voltage line for supplying a second power source voltage lower than said first power source voltage;
an output node;
a first resistor;
a second resistor;
a first bipolar transistor having a collector connected to said first power source voltage line, a base connected to said first power source voltage line through said first resistor, and an emitter connected to said output node through said second resistor;
a second bipolar transistor including a collector connected to said first power source voltage line, a base connected to said emitter of said first biplar transistor, and an emitter connected to said output node to form a Darlington circiut with said first bipolar transistor for providing a high level output at said output node in a high level outputting operation of said circiut;
a third bipolar transistor having a collector connected to said output node and an emitter connected to said second power source voltage line for providing a low level output at said output node in a low level outputting operation of said circiut; and
a P-channel field effect transistor formed on a N-well provided in a P-type substrate, said N-well being connected to said first power source voltage line, said P-channel field effect transistor having a source connected to said base of said first bipolar transistor, a drain connected to said output node, and a gate which with said emitter of said second bipolar transistor and said drain are commonly connected to said output node, wherein:
threshold voltages of said P-channel field effect transistor in said high and low level outputting operations, and base-emitter forward voltages of said first and second bipolar transistors in said high and low level outputting operations in a normal state and in said high level outputting operations in an abnormal state in which said output node is short-circuited to said second power source voltage line are determined such that said P-channel field effect transistor maintains substantialy OFF state when said circiut normally operates in said high and low level outputting operations, and turns ON only when said output node is abnormally short-circiuted to said second power source voltage line in said high level outputting operation.

2. A BiMOS semiconductor integrated circiut as claimed in claim 1, wherein said first and second bipolar transistors forming said Darlington circiut are NPN type bipolar transistors.

3. A BiMOS semiconductor intetrated circiut as claimed in claim 1, wherein said first power source voltage is a positive voltage, and said second power source voltage is a ground voltage.

4. A BiMOS semiconductor integrated circiut as claimed in claim 1, wherein said P-type substate is connected to said second power source voltage line.

5. A BiMOS semiconductor integrated circiut comprising:

a first power source voltage line for supplying a first power source voltage;
a second power source voltage line for supplying a second pwoer source voltage lower than said first power source voltage;
an output node;
a first resistor;
a second resistor;
a first bipolar transistor having a collector connected to said first power source voltage line, a base connected to said first power source voltage line through said first resistor, and an emitter connected to said output node through said second resistor;
a second biplar transistor having a collector connected to said first power source voltage line, a base connected to said emitter of said first biplar tansistor, and an emitter connected to said output node to form a Darlington circiut with said first biploar transistor for providing a high level output at said output node in a high level outputting operation of said circiut;
a third biplar transistor having a collector connected to said output node and an emitter connected to said second power source voltage line for providing a lowe level output at said output node in a low level outputting operation of said circiut;
an N-channel field effect transsitor formedon a P-well provided in a P-type substrate, said P-well being connected to said second power source voltage line, said N-channel field effect transistor having a source connected to said output node, a drain connected to said base of said first biplar transistor, and a gate commonly connected with said drain t said base of said first biplar transistor, wherein
threshold voltages of said N-channel field effect transistor in said high and lowe level outputting operations, and base-emitter forward coltages of said first and second bipolar transistors in said high and lowe level outputting operations in a normal state and in said high level outputting operation in an abnormal state in which said output node is short-circiuted to said second power source voltage line are determined such that said N-channel field effect transistor mainains substantially OFF state when said circiut normally operates in said high and low level outputting operations and turns ON only when said output node is abnormally short-circiuted to said second powwer source voltage line in said high level ouptutting opertions.

6. A BiMOS semiconductor integrated circiut as claimed in claim 5, wherein said first and second bipllar transistors forming said Dalington circiut are NPN type bipolar transistors.

7. A BiMOS semiconductor integrated circiut as claimed inc laim 5, wherein said first power source voltage is a positive voltage, and said second power source voltage is a ground voltage.

8. A BiMOS semiconductor integrated circiut as claimed in claim 5, wherein said P-type substrate is connected to said power source voltage line.

* * * * *